(12) United States Patent
Tyagi et al.

(10) Patent No.: US 6,458,667 B1
(45) Date of Patent: Oct. 1, 2002

(54) HIGH POWER PMOS DEVICE

(75) Inventors: Sunit Tyagi; Shahriar S. Ahmed, both of Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/531,805

(22) Filed: Mar. 21, 2000

Related U.S. Application Data

(62) Division of application No. 09/374,057, filed on Aug. 12, 1999, now Pat. No. 6,177,705.

(51) Int. Cl.[7] .................................................. H01L 21/336
(52) U.S. Cl. ........................ 438/303; 438/366; 438/374
(58) Field of Search .............................. 438/202, 210, 438/206, 217, 234, 366, 374, 303

(56) References Cited

U.S. PATENT DOCUMENTS 5,424,226 A * 6/1995 Vo et al. ...................... 438/202
5,444,003 A * 8/1995 Wang et al. ................. 438/202

* cited by examiner

*Primary Examiner*—David Nelms
*Assistant Examiner*—Reneé R. Berry
(74) *Attorney, Agent, or Firm*—Mark V. Seeley

(57) ABSTRACT

An improved MOS transistor and method for making it are described. The MOS transistor's source and drain have a first conductivity type and are separated from each other by a first region having a second conductivity type opposite to the first conductivity type. A second region, also having the second conductivity type, is formed adjacent to the drain and is separated from the first region by the drain.

9 Claims, 3 Drawing Sheets

HIGH POWER PMOS DEVICE

This is a Divisional Application of Ser. No. 09/374,057 filed Aug. 12, 1999, now U.S. Pat. No. 6,177,705.

FIELD OF THE INVENTION

The present invention relates to semiconductor devices and a method for making them.

BACKGROUND OF THE INVENTION

A personal computer's microprocessor may operate at a substantially lower voltage than the voltage at which the memory controller operates. In such a system, when signals are transmitted between the microprocessor and the memory controller, the input nodes of the microprocessor may be exposed to the higher voltage and the output nodes may be required to support that higher voltage. In addition, the output nodes may be required to source relatively high currents, when signals are to be transmitted from the microprocessor to the bus.

Certain features are currently added to a microprocessor, when it will be exposed to such voltages and when it must source such currents. To protect the microprocessor, when exposed to relatively high voltages, the microprocessor must include special circuitry. In essence, such special circuitry steps the voltage applied to the microprocessor's input nodes down to the microprocessor's operating voltage. To enable the output nodes to provide high currents, those nodes generally comprise wide devices. Adding such design features to the device requires setting aside relatively large chip areas, which are used for those purposes, and requires a relatively complex circuit design. Eliminating such features, which reduces die size and simplifies circuit design, is desirable.

Accordingly, there is a need for a semiconductor device that can tolerate high voltages and is capable of outputting relatively large currents. There is a need for such a device that does not require wide devices to generate high output currents or complex circuitry to protect it from high voltages. The MOS transistor of the present invention enables the production of such a device.

SUMMARY OF THE INVENTION

The present invention covers an MOS transistor that includes a gate electrode, a source and a drain. The source and the drain have a first conductivity type and are separated from each other by a first region having a second conductivity type that is opposite to the first conductivity type. A second region, which also has the second conductivity type, is formed adjacent to the drain and is separated from the first region by the drain. The present invention also covers a method for making such an MOS transistor.

DETAILED DESCRIPTION OF THE PRESENT INVENTION

Figure 1:
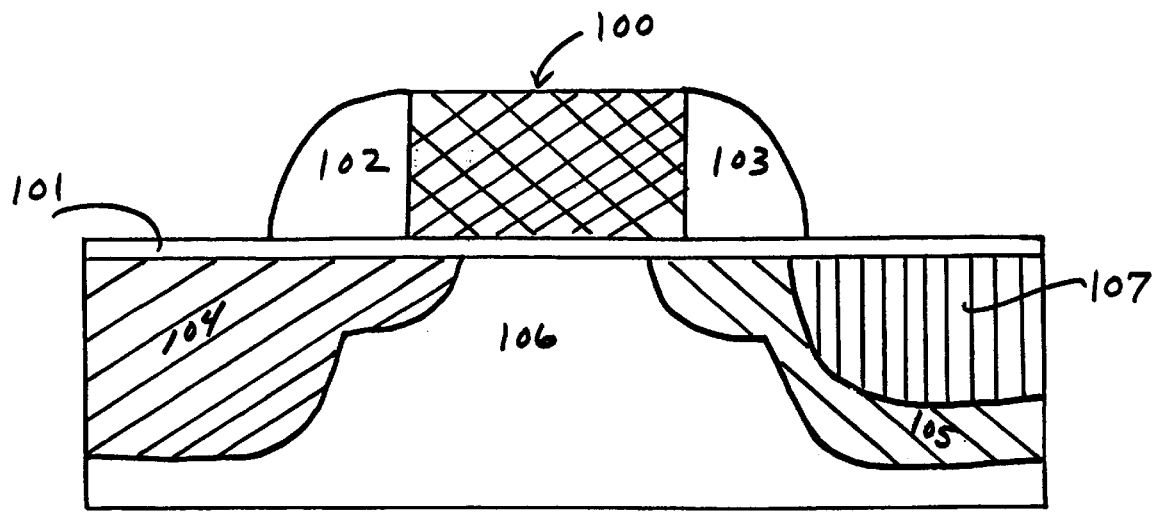
FIG. 1 is a schematic representing a cross-section of the transistor of the present invention.

An improved MOS transistor and method for making it are described. FIG. 1 is a schematic representing a cross-section of the transistor of the present invention that includes gate electrode 100 formed on gate oxide 101. Gate electrode 100 may be formed from a heavily doped polysilicon layer or the combination of such a layer and a silicide. On the sides of gate electrode 100 are spacers 102 and 103. Spacers 102 and 103 may be formed from the combination of a relatively thin silicon dioxide layer and a relatively thick silicon nitride layer.

Beneath gate oxide 101 are source 104 and drain 105. Source 104 and drain 105 each have a first conductivity type and are separated from each other by first region 106. First region 106 has a second conductivity type that is opposite to the first conductivity type. The transistor of the present invention further includes second region 107, which also has the second conductivity type. Second region 107 is formed adjacent to drain 105 and is separated from first region 106 by drain 105.

Although the MOS transistor of the present invention may be NMOS or PMOS, in a preferred embodiment it is a PMOS transistor. When a PMOS transistor, source 104 and drain 105 are each doped P+—with source 104 and drain 105 preferably including lightly doped (i.e., P−) extensions that extend underneath gate electrode 100. First region 106 is preferably doped N− and second region 107 is doped N+. N+ second region 107, P+ drain 105 and N− first region 106 form an NPN bipolar device, and P+source 104, N− first region 106 and P+ drain 105 form a PNP bipolar device. Because, in operation, current fed into N− first region 106 feeds the base of the PNP device and current fed into P+ drain 105 feeds the base of the NPN device, the resulting structure forms a thyristor.

Set forth below is a description of a preferred process for making the MOS transistor described above. This description is made with reference to FIGS. 2a–2e, which provide schematics representing cross-sections of structures that result after using certain steps.

To make the transistor represented by FIG. 1, ions are implanted into an epitaxial layer formed on a bulk silicon substrate to create well 220. When forming a PMOS transistor, n-type impurities (e.g., arsenic, phosphorus or both) are deposited to form n-well 220. After gate oxide 201 is formed on n-well 220, a polysilicon layer is deposited on gate oxide 201, then etched to define a gate electrode. Etched polysilicon layer 210 lies above first region 206, which lies between source region 211 and drain region 212. Polysilicon layer 210 will already be heavily doped (P+), or will be doped P+ by the subsequent P+ source/drain implant. Part of first region 206 will ultimately form the transistor's channel.

Following a relatively low dose tip implant step (for forming extensions of the source and drain), which may be followed by a tilted halo implant step, spacers 202 and 203 are formed on the sides of polysilicon layer 210. Spacer 202 covers part of source region 211, and spacer 203 covers part of drain region 212.

Figure 2A:
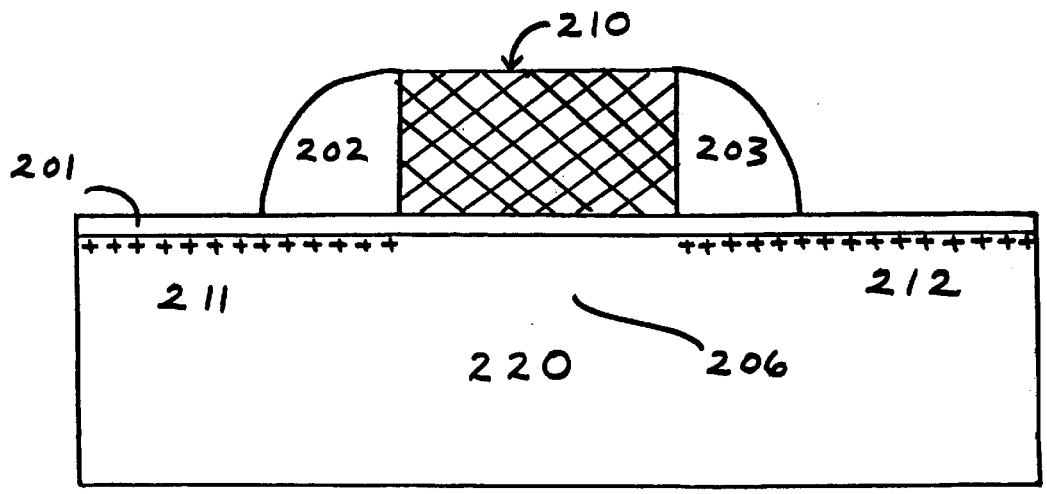
FIGS. 2a–2e are schematics representing cross-sections of structures that may result after certain steps are used, when making the transistor represented by FIG. 1.

Spacers 202 and 203 may be formed by first depositing a relatively thin layer of silicon dioxide then depositing on that layer a relatively thick layer of silicon nitride. A subsequent anisotropic etch step removes those two layers, except along the sides of polysilicon layer 210. A cross-section representing the resulting structure is shown in FIG. 2a—where "+" represents the deposition of p-type impurities (e.g., boron) into source region 211 and drain region 212. This structure, which is like those typically made when forming MOS transistors, may be made using conventional materials and process steps, as will be apparent to those skilled in the art.

After forming spacers 202 and 203, a layer of photoresist 213 may be deposited over the resulting structure using conventional materials and process steps. Such a layer is deposited at this point in current processes to enable the masking of the structures that will form an integrated circuit's PMOS devices from the N+implants that will be applied to form the source and drain for the integrated circuit's NMOS devices.

Figure 2B:
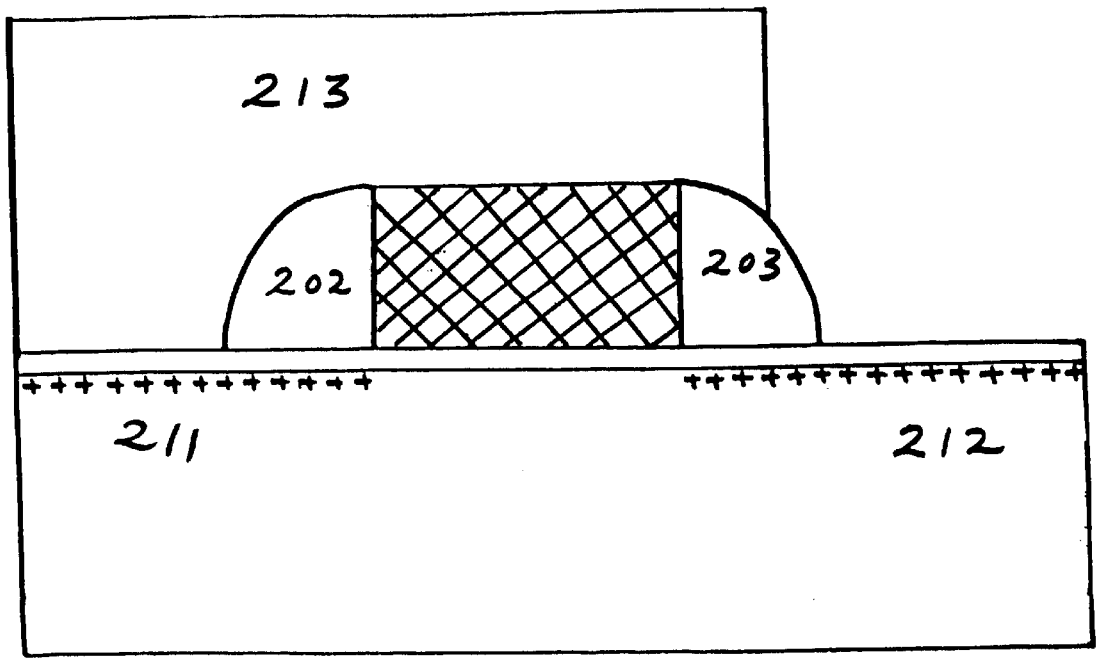
Figure 2C:
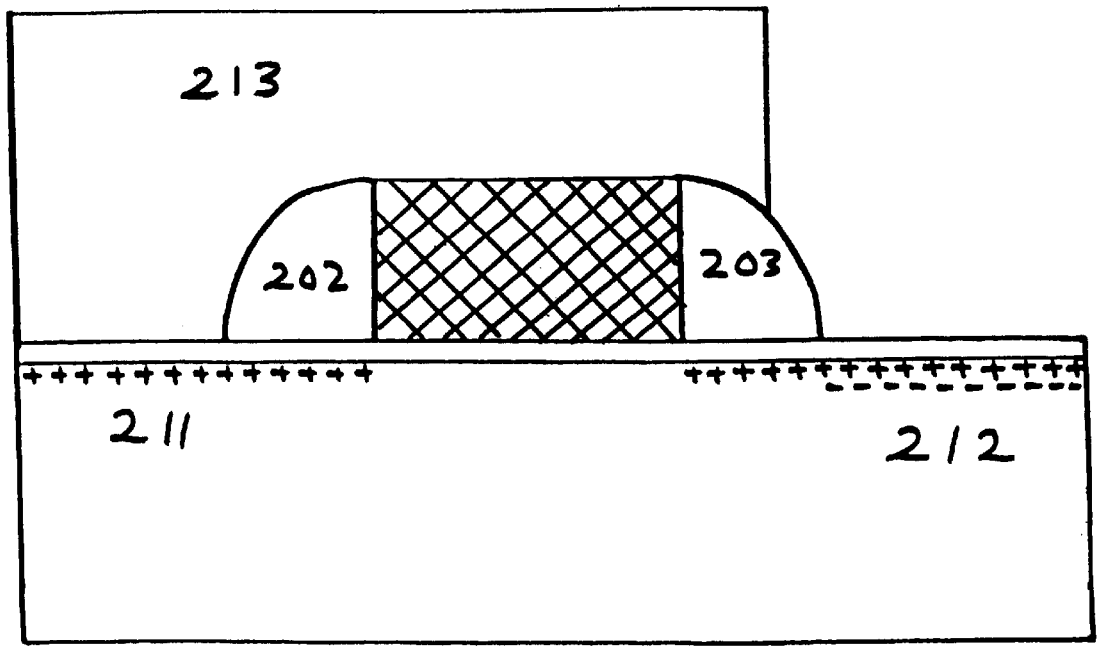

To form the transistor of the present invention, a portion of layer 213 that lies above drain region 212 is removed, preferably at the same time layer 213 is etched to expose the NMOS devices, forming the structure represented by FIG. 2b. By removing that portion of layer 213, drain region 212 is exposed to the subsequent N+ implant step, which is used to form the source and drain for NMOS devices. During that implant step, n-type impurities, preferably arsenic, are deposited into the portion of drain region 212 that is not covered by spacer 203. The designation "−", shown in FIG. 2c, represents the implantation of n-type impurities into the unmasked part of drain region 212.

Figure 2D:
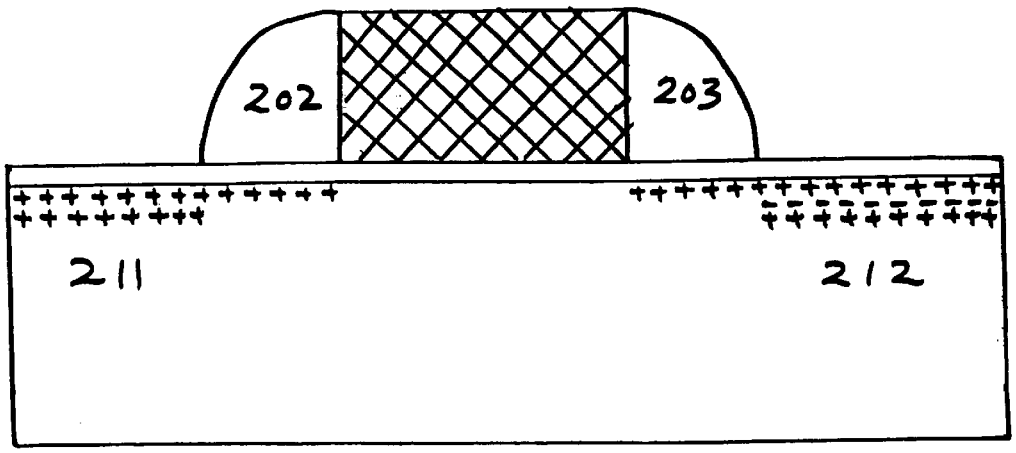

After the N+ implant step, photoresist layer 213 is removed. After masking off the NMOS devices (not shown), p-type impurities, preferably boron, are implanted into the portions of source region 211 and drain region 212, which are not covered by spacers 202 and 203. FIG. 2d shows that p-type impurities (designated "+"), for forming the heavily doped portions of the source and drain, are implanted only into unmasked portions of source and drain regions 211 and 212.

Figure 2E:
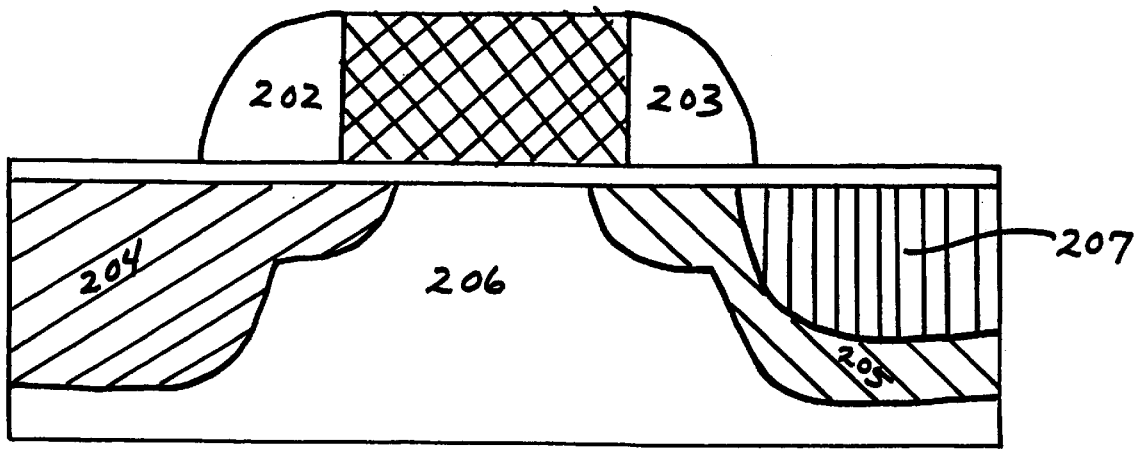

Following the P+ source/drain implant step, a conventional heating step (or steps) is applied to activate the dopants. That heating step causes the dopants to diffuse both vertically and laterally. Because boron diffuses faster than arsenic, when boron is used to form P+ source and drain 204 and 205 and arsenic is used to form N+ second region 207, the boron will diffuse further into the n-well than the arsenic. As a result, at the end of the heating step, the boron that forms drain 205 will enclose the arsenic containing N+ second region 207, such that P+ drain 205 separates N+ region 207 from N− region 206. FIG. 2e represents the resulting structure.

In sum, to make the PMOS transistor of the present invention, which provides a gate controlled thyristor function, the conventional process for making such a transistor is varied only slightly. To make such a device, the conventional process is modified to enable removal of the photoresist layer from the drain region of the PMOS device prior to the N+ source/drain implant. This can be accomplished by simply altering the mask used to expose the NMOS devices so that the PMOS drain region will also be exposed to the N+ source/drain implant.

When making a PMOS transistor, following the teachings of the present invention, N+ second region 207 preferably comprises arsenic at a concentration between about $10^{19}$ and about $10^{21}$. In addition, P+ drain 205 preferably comprises boron at a concentration between about $10^{18}$ and about $10^{20}$, and N− first region 206 preferably comprises arsenic or phosphorus at a concentration between about $10^{16}$ and about $10^{18}$. In the resulting transistor, N+ second region 207 preferably is separated from N− first region 206 by between about 500 and about 1,000 angstroms.

Although one way to form the MOS transistor of the present invention requires nothing more than altering the mask used to define the regions that will be exposed to the N+ source/drain implant, the invention is clearly not so limited. Additional masking and implantation steps may be used to vary the dopant concentrations and profiles of N+ second region 207, P+ drain 205 and N− first region 206, or to otherwise optimize device features for use in particular applications.

The following examples show how the PMOS transistor of the present invention operates under different bias conditions. In those examples, bias applied to source 104, drain 105, second region 107 (the cathode, in keeping with conventional nomenclature for thyristors), first region 106 (formed within the n-well), and the gate electrode are Vs, Vd, Vk, Vnw, and Vg respectively.

EXAMPLE 1

Vg=1.3V Vs=1.3V Vd=0V Vk=0V Vnw=1.3V

Under these bias conditions, the PMOS transistor is off. Because the PNP and NPN devices do not have any base/emitter bias (Vk−Vd=0V, and Vs−Vnw=0 v), those devices are off, too.

EXAMPLE 2

Vg=0V Vs=1.3V Vk=0 to 0.6V Vnw=1.3V

Here, the PMOS is on, causing holes to be injected into the drain, which raises the P+ drain potential. This forward biases the cathode/drain junction (i.e., the junction between N+ second region 107 and P+ drain 105), causing injection of electrons from N+ second region 107 into P+ drain 105. By bipolar action, these electrons flow into N− first region 106, which forms a base current for the PNP transistor, which turns it on and causes higher current to flow into the cathode, i.e., N+ second region 107.

This NPN/PNP loop can latch depending on the loop gain, enabling conduction of relatively large currents with low voltage drop. As long as a sufficient voltage differential remains between the N+ cathode and the P+ drain to forward bias the N+ cathode to the P+ drain, the device will continue sourcing current. When Vg is returned to 1.3V, the PMOS transistor turns off, which reduces the output current. The NPNP thyristor will likewise turn off, when the required holding voltage is not maintained on the cathode.

EXAMPLE 3

Vs=1.3V Vk>0.6V Vnw=1.3V

In this case, the voltage drop across the NPNP structure is not sufficient to hold the NPN/PNP loop in the latched position. Under these conditions, the overall current flow is controlled by turning on the PMOS device. Although the NPNP structure provides additional gain to the PMOS current, that structure does not latch. As a result, device switching is fully under gate electrode control.

EXAMPLE 4

Vs=1.3V Vk>1.3V Vnw=1.3V

Under these conditions, N+ second region 107 and P+ drain 105 are reversed biased. As a result, the voltage drops significantly across the N+/P+ junction. This ensures that the high cathode voltage (Vk) will not apply to the drain 105, gate electrode 100, and gate oxide 101 regions, which protects gate oxide 101 from voltage related damage.

The transistor represented by FIG. 1 thus may be used to form input/output nodes for an integrated circuit that can source relatively large amounts of current and power and that may be exposed to voltages that are higher than the device's operating voltage. Such capability results from that transistor's NPNP structure being able to source relatively high currents at low forward resistance, while also providing a reverse voltage blocking function. As indicated above, such a device may tolerate relatively high output node voltages without stressing the reliability of the gate oxide, as the N+ cathode/P+ drain will be reverse biased, which will ensure that the bias applied to the gate oxide will be lower than the bias applied to the output node.

In addition, devices made in accordance with the present invention may withstand exposure to electrostatic discharge. An ESD event may cause a significant amount of charge to be applied to an output node. If that charge causes the N+/P+ junction to be forward biased, the thyristor will fire, which will dissipate the charge and protect the device's circuitry. Conversely, if the charge causes a reverse biased condition, the high N+/P+ leakage can likewise serve to quickly dissipate charge.

Features shown in the above referenced drawings are not intended to be drawn to scale, nor are they intended to be shown in precise positional relationship. Additional process steps that may be used to make the embodiments described above have been omitted when not useful to describe aspects of the present invention.

Although the foregoing description has specified an MOS transistor that includes certain features, and has specified certain materials and process steps for making such a device, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of forming an MOS transistor comprising:
   defining a gate electrode above a first region that lies between a source region and a drain region;
   forming a source and a drain, which have a first conductivity type, that are separated from each other by the first region, which has a second conductivity type opposite to the first conductivity type; and
   forming a second region, also having the second conductivity type, which is formed adjacent to the drain and is separated from the first region by the drain.

2. The method of claim 1 wherein the second region is formed by masking the source region, then depositing n-type impurities into the unmasked drain region.

3. The method of claim 2 wherein arsenic is implanted into the unmasked drain region followed by implanting boron into the unmasked drain region, then applying a sufficient amount of heat for a sufficient amount of time to cause the boron to form a P+ drain that separates an arsenic containing N+ second region from an N+ first region.

4. A method of forming a high power PMOS transistor comprising:
   defining a gate electrode above an N– first region that lies between a source region and a drain region;
   forming a P+ source and a P+ drain separated from each other by the N– first region; and
   forming an N+ second region adjacent to the P+ drain and separated from the N– first region by the P+ drain.

5. The method of claim 4 wherein the N+ second region is formed by depositing then etching a polysilicon layer to define the gate electrode;
   forming spacers on the sides of the etched polysilicon layer to cover part of the source region and part of the drain region;
   masking the source region; then
   implanting arsenic into the unmasked drain region to form the N+ second region, wherein
   the spacer, which covers part of the drain region, separates the implanted arsenic from the edge of the polysilicon layer.

6. The method of claim 5 further comprising implanting boron into the unmasked drain region, after implanting the arsenic, followed by applying a sufficient amount of heat for a sufficient amount of time to cause the boron to form the P+ drain that separates the N+ second region from the N– first region.

7. The method of claim 6 wherein the boron containing P+ drain encloses the arsenic containing N+ second region and forms the base of an NPN bipolar device, and wherein the N+/P+ junction that separates the P+ drain from the N+ second region lies beneath the spacer, which covers part of the drain region.

8. The method of claim 7 wherein the N+ second region is separated from the N– first region by between about 500 and about 1,000 angstroms.

9. A method for making a PMOS transistor, having a gate electrode, a source and a drain, comprising forming a region having n-type conductivity adjacent to the drain, which is separated from an n-well by the drain.

* * * * *

UNITED STATES PATENT AND TRADEMARK OFFICE
CERTIFICATE OF CORRECTION

PATENT NO. : 6,458,667 B1
DATED : October 1, 2002
INVENTOR(S) : Tyagi et al.

It is certified that error appears in the above-identified patent and that said Letters Patent is hereby corrected as shown below:

Column 6,
Line 4, delete second occurrence of "N+", insert -- N- --.

Signed and Sealed this

Eighteenth Day of February, 2003

JAMES E. ROGAN
*Director of the United States Patent and Trademark Office*